US010200019B2

(12) United States Patent
Zupke et al.

(10) Patent No.: US 10,200,019 B2
(45) Date of Patent: Feb. 5, 2019

(54) POWER REMOVAL MONITOR CIRCUIT FOR INTERFACE DISCONNECT DETECT

(71) Applicant: APPLE INC., Cupertino, CA (US)

(72) Inventors: Robert D. Zupke, Santa Clara, CA (US); Priyank D. Patel, San Jose, CA (US); Gerhard A. Schneider, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 182 days.

(21) Appl. No.: 15/259,648

(22) Filed: Sep. 8, 2016

(65) Prior Publication Data

US 2017/0070010 A1 Mar. 9, 2017

Related U.S. Application Data

(60) Provisional application No. 62/215,546, filed on Sep. 8, 2015.

(51) Int. Cl.
*H03K 3/3565* (2006.01)
*G06F 13/38* (2006.01)
*G06F 13/40* (2006.01)

(52) U.S. Cl.
CPC ......... *H03K 3/3565* (2013.01); *G06F 13/385* (2013.01); *G06F 13/4081* (2013.01)

(58) Field of Classification Search
CPC . G06F 1/00; G06F 1/30; G06F 13/385; G06F 13/00; G06F 13/4081; H02J 7/00; H02J 7/34; H02J 9/00; H02J 9/06; H02J 9/061; H02J 9/062; H03K 3/00; H03K 3/3565
USPC .......................................................... 307/66
See application file for complete search history.

(56) References Cited

U.S. PATENT DOCUMENTS

2017/0262035 A1* 9/2017 Agarwal ................. G06F 1/266

OTHER PUBLICATIONS

Universal Serial Bus Type-C Cable and Connector Specification (Revision from Apr. 3, 2015), USB 3.0 Promoter Group, Mar. 25, 2016, 248 pages.
Universal Serial Bus Type-C Cable and Connector Specification (Revision 1.0), USB 3.0 Promoter Group, Aug. 11, 2014, 171 pages.
Universal Serial Bus Type-C Cable and Connector Specification (Revision 1.2), USB 3.0 Promoter Group, Mar. 25, 2016, 221 pages.

* cited by examiner

*Primary Examiner* — Lincoln Donovan
*Assistant Examiner* — David Mattison
(74) *Attorney, Agent, or Firm* — Kilpatrick Townsend & Stockton, LLP

(57) ABSTRACT

Circuits, methods, and apparatus that may compensate for an incompatibility between connection detection schemes used by different interface circuits for different connector receptacles. One example may provide an active pull-down that normally provides a pull-down resistor and provides an open circuit for a period of time following a disconnection of an interface from a cable.

19 Claims, 9 Drawing Sheets

POWER REMOVAL MONITOR CIRCUIT FOR INTERFACE DISCONNECT DETECT

CROSS REFERENCE TO RELATED APPLICATIONS

The present application claims the benefit of U.S. Provisional Application No. 62/215,546, filed Sep. 8, 2015, which is hereby incorporated by reference for all purposes.

BACKGROUND

The number of types of electronic devices that are commercially available has increased tremendously the past few years and the rate of introduction of new devices shows no signs of abating. Devices such as tablet, laptop, netbook, desktop, and all-in-one computers, cell, smart, and media phones, storage devices, portable media players, navigation systems, monitors, and others, have become ubiquitous.

Power and data may be provided from one device to another over cables that may include one or more wire conductors, fiber optic cables, or other conductor. Connector inserts may be located at each end of these cables and may be inserted into connector receptacles in the communicating or power transferring devices in order to provide pathways for data and power between them.

In some electronic systems, a user may want to connect a first device having a first type of connector receptacle to a second device having a second type of connector receptacle. In some systems, an incompatibility between the two types of connector receptacles cannot be overcome. That is, the interface circuits used by the two connector receptacles may be incompatible. In other systems, there may be no, or only a limited, incompatibility. In this case, a cable having different connector inserts that correspond to the different connector receptacles may be used to convey data, power, or both. In some systems this cable may be a pass-through cable. In other systems, circuitry may be included in the cable to compensate for an incompatibility between the connector receptacles.

Thus, what is needed are circuits, methods, and apparatus that may compensate for an incompatibility between different interface circuits for different connector receptacles.

SUMMARY

Accordingly, embodiments of the present invention may provide circuits, methods, and apparatus that may compensate for an incompatibility between different interface circuits for different connector receptacles.

An illustrative embodiment of the present invention may provide circuits, methods, and apparatus that may compensate for an incompatibility between a first interface circuit for a first connector receptacle of a first device that employs a connection detection scheme and a second interface circuit for a second connector receptacle of a second device that does not employ a connection detection scheme, or employs a different connection detection scheme. In an embodiment of the present invention, the first interface circuit and first connector receptacle may be a Universal Serial Bus Type-C (USB Type-C) interface circuit and connector receptacle, or more generally a USB Type-C interface.

In a USB Type-C system, a USB Type-C interface, which may be referred to as a port, may employ a connection detection scheme where a first interface circuit of a first device detects a resistor pull-up or pull-down in a second interface circuit of a second device. As one example, circuitry coupled to a connection detect pin (referred to as a "CC" pin) in a downward-facing port (DFP), or a dual-role port (DRP) acting as a DFP, of the first device may detect the presence of a pull-down resistor on a connection detect or CC pin in an upward-facing port (UFP) of the second device. When a pull-down resistor is detected by the connection detect or CC pin of the DFP of the first device, the DFP of the first device may determine that the first device is connected to the second device.

But often it may be desirable to connect a downward-facing port to a second, different type of interface on a second device. This second interface of the second device may not have a pull-down resistor to be detected by the connection detect or CC pin of the downward-facing port of the first device. Accordingly, embodiments of the present invention may compensate for this incompatibility by providing an active pull-down in a cable that connects the downward-facing USB Type-C port to the second interface. This active pull-down may be detected by the downward-facing port such that the downward-facing port may detect a connection and begin communicating or providing power to the second, different type of interface on the second device.

One illustrative embodiment of the present may provide a cable having an active pull-down circuit that appears as a pull-down resistor to the connection detect or CC pin of the downward-facing port of the first device when the cable is connected. This cable may connect the downward-facing port of the first device to a second interface of a second device. The active pull-down circuit may disconnect and appear as an open circuit for a period of time following a disconnection of the cable from the second interface of the second device. This active pull-down circuit may be located in either connector insert or elsewhere in the cable connecting the downward-facing USB Type-C port of a first device to the second, different type of interface on a second device. This active pull-down circuit may include a resistor in series with a switch. The switch may be normally closed such that the connection detect or CC pin of the downward-facing USB Type-C port of the first device may detect a pull-down resistor and may communicate or share power with the second device. When the second interface of the second device is disconnected from the cable, the switch may open for a period of time such that the disconnection is detected by the downward-facing USB Type-C port of the first device, whereby the first device may cease data communications and power sharing with the second device.

More specifically, when a cable provided by an embodiment of the present invention is attached to a downward-facing USB Type-C port of a first device, the connection detect or CC pin on the downward-facing port may detect the pull-down resistor in the active pull-down circuit. The DFP may determine that a connection to a second device has been made and may accordingly begin sharing data and providing a power supply voltage. The power supply may be referred to as VBUS. This VBUS power supply voltage may be a relatively low voltage, for example 5 Volts, and may have a series resistance for protection purposes. When a second interface is connected to the cable, the DFP may reduce the series resistance and the DFP and the second interface may negotiate for a higher voltage, such as 20 Volts, to be provided to the second interface. This higher voltage may then be provided.

If the second interface were then disconnected and the pull-down resistor remained in place, the DFP would not detect the disconnection and would continue to provide the higher voltage. If the second interface—or a third interface—were to be connected while the DFP was providing this higher voltage, the newly connected interface would likely not accept the higher voltage since it was not negotiated for. The newly connected interface could even become damaged due to the high voltage.

Accordingly, the active-pull down circuit may disconnect the pull-down resistor from the connection detect or CC pin of the DFP of the first device for a period of time following a disconnection of the second interface from the cable. This may allow the DFP of the first device to detect the disconnection and stop providing a higher-voltage VBUS power supply. The pull-down resistor may reconnect following this period of time, in which case the DFP may detect a connection and again provide a lower-voltage supply.

In an illustrative embodiment of the present invention, an active pull-down circuit may include a pull-down resistor in series with a switch, which may be a transistor or other type of switch. The switch may be controlled by a charge storage circuit that may open the switch for a period of time following a disconnection of the second interface from the cable. The charge storage circuit may discharge during a period of time during which the switch may remain open. Once the charge storage circuit has sufficiently discharged, the switch may again close.

Embodiments of the present invention may provide active pull-down and other circuits that may be used with cables connecting various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These cables may provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
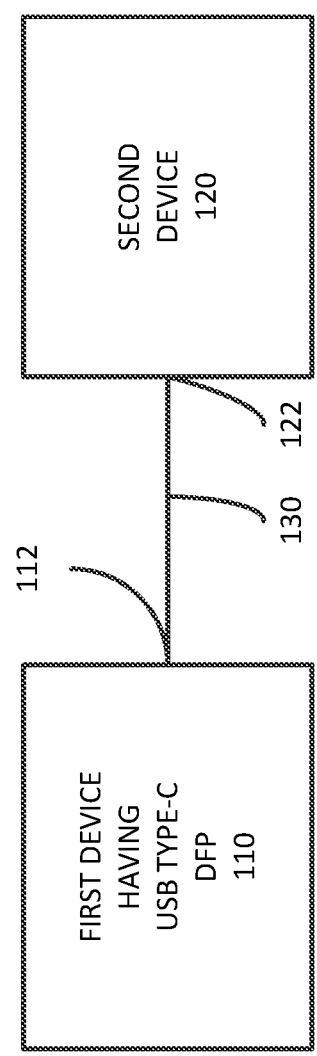
FIG. 1 illustrates an electronic system according to an embodiment of the present invention.

FIG. 1 illustrates an electronic system according to an embodiment of the present invention. This figure, as with the other included figures, is shown for illustrative purposes and does not limit either the possible embodiments of the present invention or the claims.

In this example, a first device 110 having a USB Type-C downward-facing port 112 may be connected to a second device 120 having a second, different type of interface 122 in order to share data, power, or both. Specifically, the downward-facing port 112 on first device 110 may be electrically connected to second interface 122 on second device 120. Contacts of downward-facing port 112 may be electrically connected to contacts of second interface 122 via cable 130.

Downward-facing port 112 may use a connection detection scheme to determine whether it is connected to a remote interface, such as second interface 122. But the second interface 122 may not employ a connection detection scheme, or it may employ an incompatible connection detection scheme. Without more, downward-facing port 112 may not be able to determine that the second device 120 is connected via second interface 122.

Accordingly, embodiments of the present invention may provide circuitry to interoperate with the downward-facing port in determining whether a second interface 122 that does not employ connection detection, or does not employ connection detection that is compatible with the downward-facing port, is connected. This circuitry may be located in a cable, adapter, dongle, or other assembly, or in another location, such as in devices 110, 120, or both devices 110 and 120. This circuitry may be located in one of the connector inserts or elsewhere in such an assembly. An example of such a cable assembly is shown in the following figures.

Figure 2:
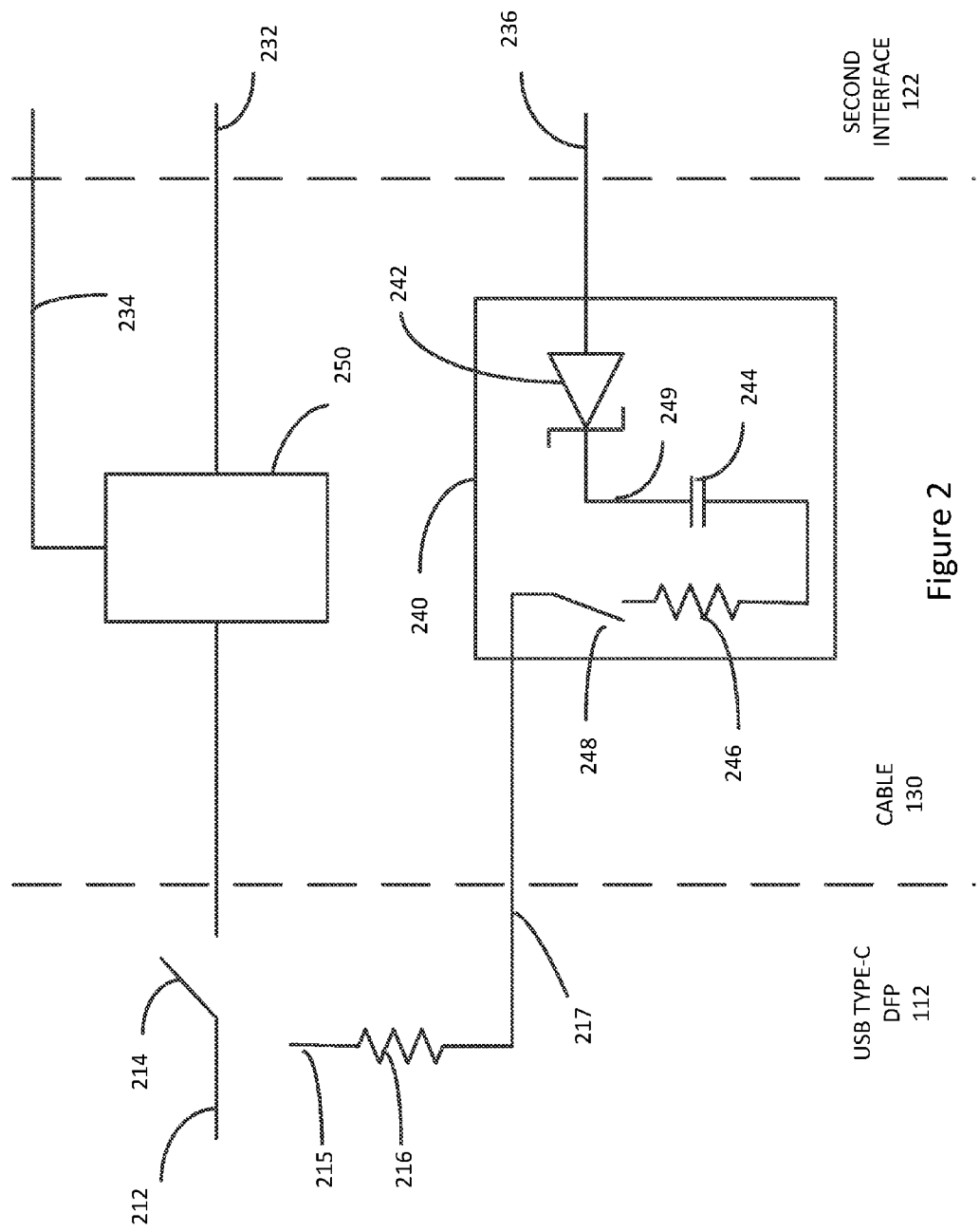
FIG. 2 illustrates a cable apparatus according to an embodiment of the present invention.

FIG. 2 illustrates a cable apparatus according to an embodiment of the present invention. In this example, cable 130 may connect downward-facing USB Type-C port 112 to a second interface 122. Downward-facing port 112 may provide power on line 212 to second interface 122 on line 232. Specifically, downward-facing port 112 may provide a VBUS power supply voltage on line 212. When a connection is detected, switch 214 may close such that the VBUS power supply voltage on line 212 is provided to power circuitry 250. Power circuitry 250 may then provide a voltage on line 232 to second interface 122. Second interface 122 may identify itself over line 234 to power circuitry 250. When second interface 122 identifies itself to power circuitry 250, power circuitry 250 may remove a series resistance that may be provided in order to limit current that may be drawn from the power supply on an exposed contact in a cable insert when second interface 122 is not connected.

Downward-facing port 112 may include pull-up resistor 216 connected to connection detect or CC pin 217. Resistor 216 may be connected between the connection detect or CC pin 217 and a positive voltage on line 215. Cable 130 may include in active pull-down circuit 240. Active pull-down circuit 240 may provide a pull-down resistor 246 that acts to form a resistor divider with pull-up resistor 216 in downward-facing port 112. This resistor divider may generate an intermediate voltage at the connection detect or CC pin 217. This intermediate voltage may be detected by downward-facing port 112 and used to determine that downward-facing port 112 is connected. More specifically, the intermediate voltage on connection detect or CC pin 217 may be used by the downward-facing port 112 to determine that a connection has been made and that switch 214 should be closed such that the VBUS power supply on line 212 may be received by power circuitry 250. Power circuitry 250 may provide a power supply voltage on line 232 to second interface 122. The second interface 122 and downward-facing port 112 may negotiate for higher voltages to be provided by downward-facing port 112 to second interface 122.

Second interface 122 may receive power on line 232 from power circuitry 250. This power supply on line 232 may be used to generate an accessory power supply voltage on line 236, which may be provided to cable 130. Active pull-down circuit 240 in cable 130 may receive the accessory power supply voltage on line 236. Diode 242 may conduct current to charge capacitor 244. Diode 242 may disconnect when voltage 236 falls to zero following a disconnection of second interface 122, thereby maintaining the charge on charge storage capacitor 244 following the disconnection.

If active pull-down circuit 240 were to be replaced with a simple pull-down resistor, the downward-facing port 112 might not be able to detect a disconnection when a second interface 122 is disconnected from cable 130. This is a particular problem if a higher voltage on line 232 has been negotiated. This higher voltage would continue to be provided on line 232 since no disconnection has been detected by the downward-facing port 112. Specifically, if second interface 122 is reconnected, it may be unable to accept this higher voltage since it has not been negotiated after second interface 122 has been reconnected. This higher voltage may also damage the second interface 122. Also, a third interface (not shown) may be damaged if it is connected and receives the higher voltage.

Accordingly, after second interface 122 is disconnected from cable 130, switch 248 in active pull-down circuitry 240 may open. This may allow a voltage on the connection detect or CC pin 217 to pull high. This high voltage may be used by downward-facing port 112 to determine that a disconnection has occurred. In this case, switch 214 may open and the voltage on line 232 may be reduced. This reduction may allow the second interface 122 or a new third interface to be connected.

The circuitry in this figure and the other figures is shown in particular locations for illustrative purposes. In other embodiments of the present invention, these circuits may be located elsewhere. For example, power circuitry 250 may be located in a first device 110 or downward-facing port 112, in a connector insert or elsewhere in cable 130, in a second device 120 or second interface 122, or elsewhere in an electronic system. Active pull-down circuit 240 may be located in a first device 110 or downward-facing port 112, in a connector insert or elsewhere in cable 130, in a second device 120 or second interface 122, or elsewhere in an electronic system.

In a specific embodiment of the present invention, switch 248 may remain open for a first period of time following a disconnection of second interface 122 from cable 130. This first print of time may be determined by a discharge rate on charge storage capacitor 244. A sequence of events that may occur as cable 130 and second interface 122 are connected and then disconnected is shown in the following figures.

Figure 3:
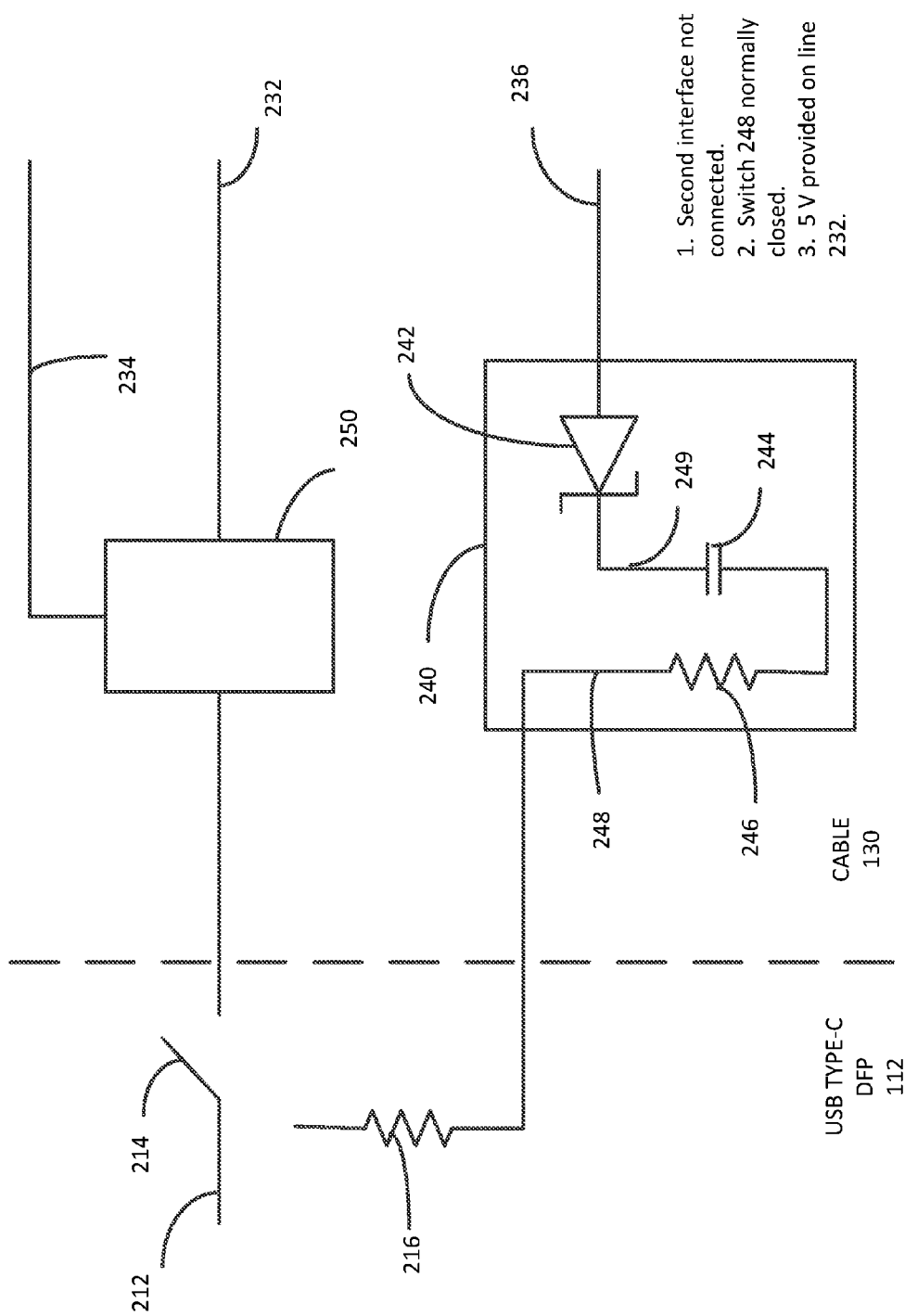
FIGS. 3-5 illustrate the operation of a cable apparatus according to an embodiment of the present invention.
Figure 4:
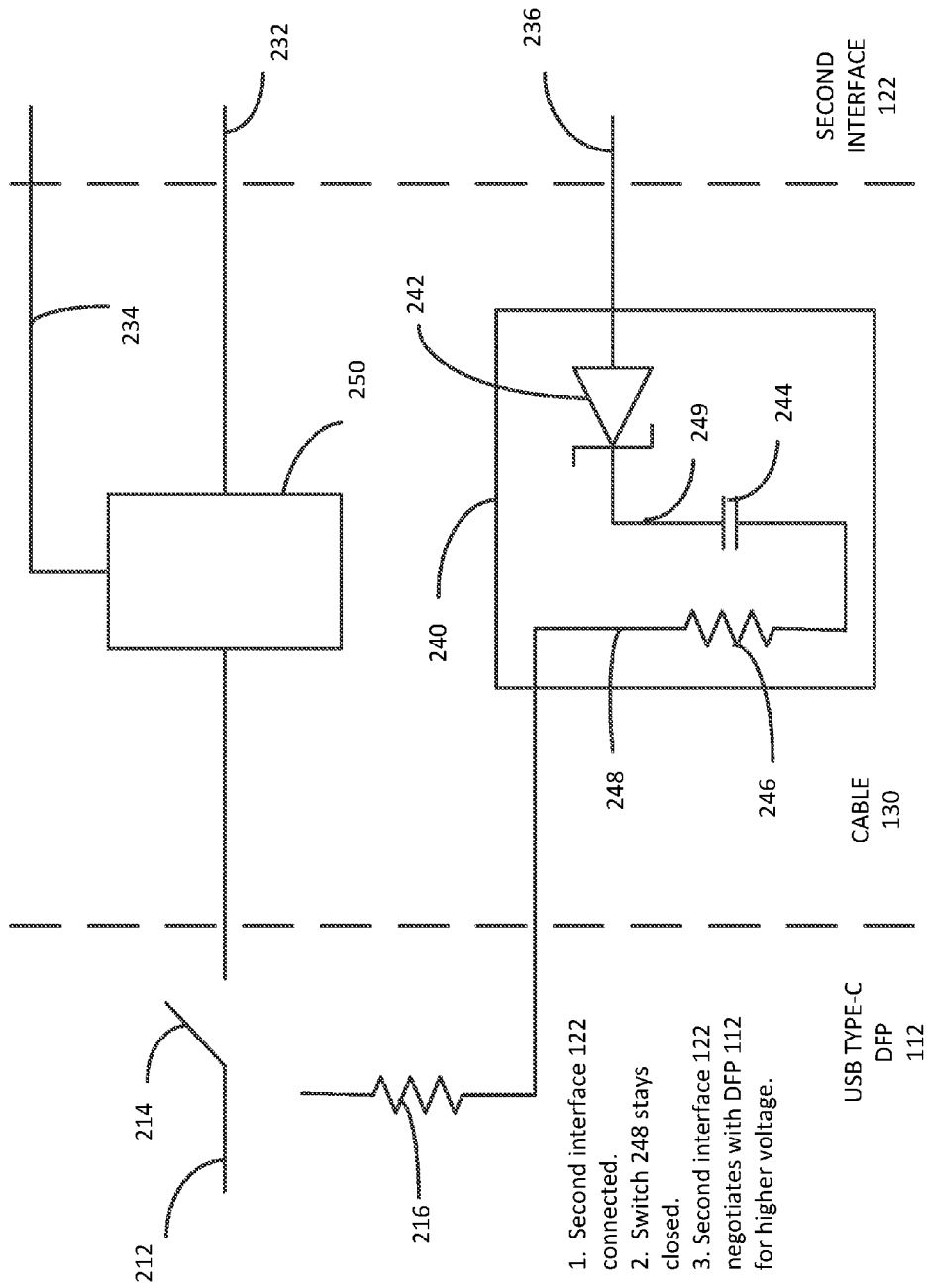
Figure 5:
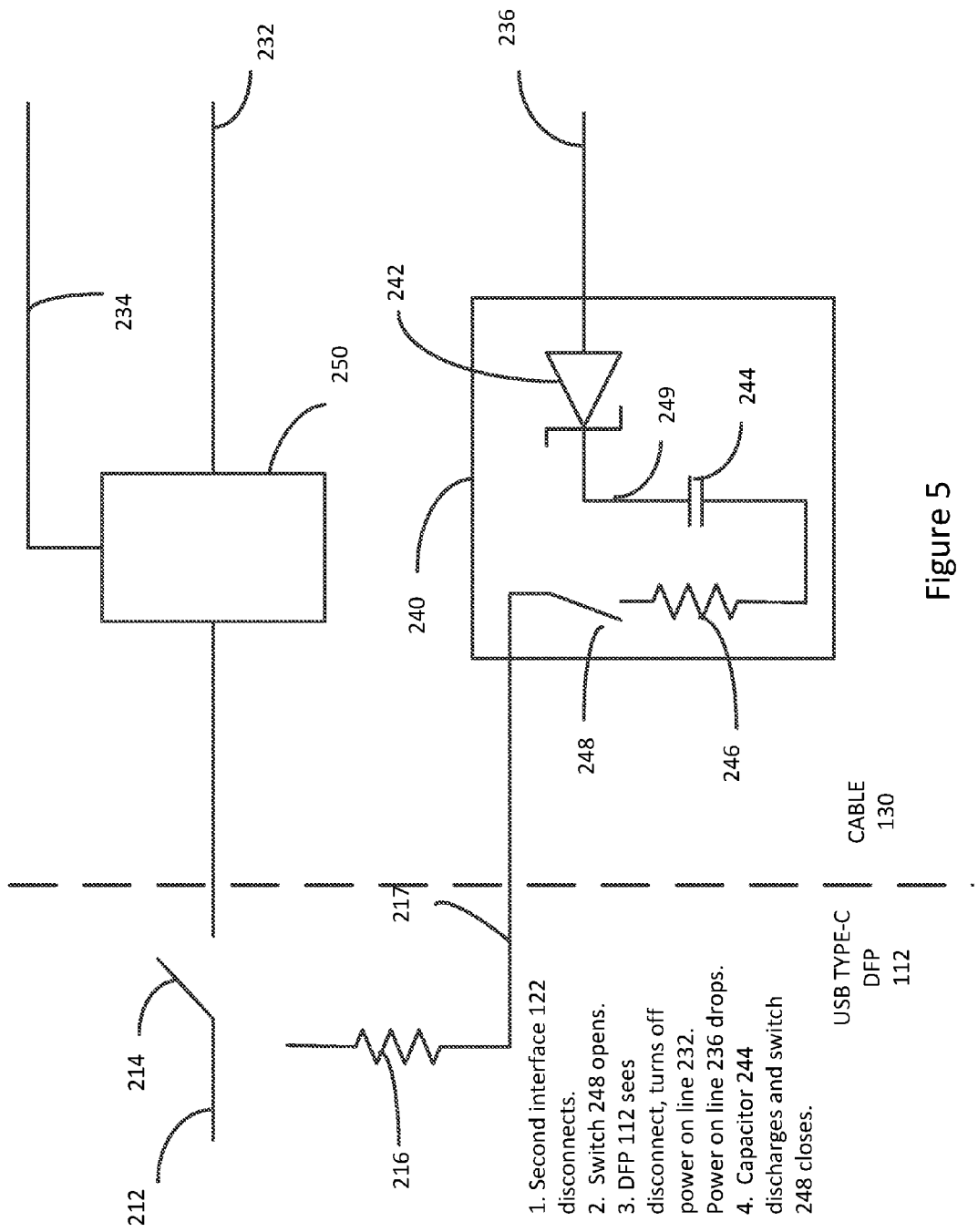

FIGS. 3-5 illustrate the operation of a cable apparatus according to an embodiment of the present invention. In FIG. 3, cable 130 is not connected to a second interface 122. Switch 240 is normally closed and provides a pull-down on connection detect or CC pin 217. This pull-down may generate an intermediate voltage on connection detect or CC pin 217. This intermediate voltage may be used by the downward-facing port 112 to determine that it is connected to a device and should close switch 214. Accordingly, downward-facing port 112 may close switch 214 and provide a low voltage, for example 5 V, on line 232 through power circuitry 250. Power circuitry 250 may include a series resistance to limit current that may be available at an exposed contact of a connector insert.

In FIG. 4, second interface 122 has been connected to cable 220. Switch 248 may stay closed, continuing to provide a pull-down resistor 246. Second interface 122 and downward-facing port 112 may negotiate for the VBUS power supply voltage on line 232 to be increased by downward-facing port 112. As a result of these negotiations, the VBUS voltage on line 232 may be increased.

In FIG. 5, second interface 122 may be disconnected. Switch 248 may open, allowing the voltage on connection detect or CC pin 217 to rise. The connection detect or CC pin 217 of downward-facing port 112 may see this rising voltage as a disconnection and turn off the power on line 232, for example by opening switch 214. Switch 248 may open until capacitor 244 discharges at which time switch 248 may close. At this time, downward-facing port 112 and cable 130 have returned to the state shown in FIG. 3 and may again be ready to be connected to second interface 122, or a new interface.

Various circuits may be used for the active pull-down circuit 240 consistent with an embodiment of the present invention. An example is shown in the following figures.

Figure 6:
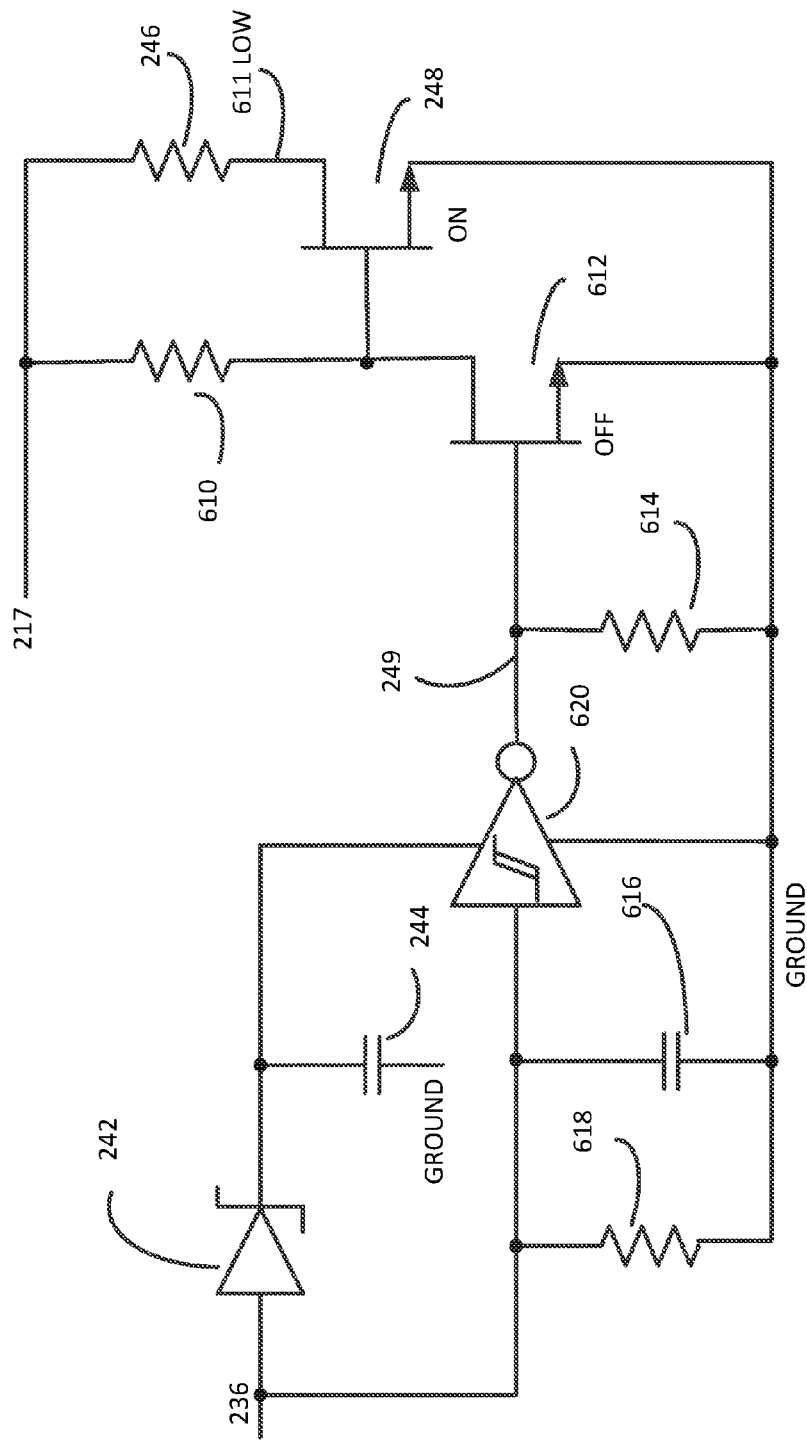
FIG. 6-8 illustrate the operation of an active pull-down circuit according to an embodiment of the present invention.
Figure 7:
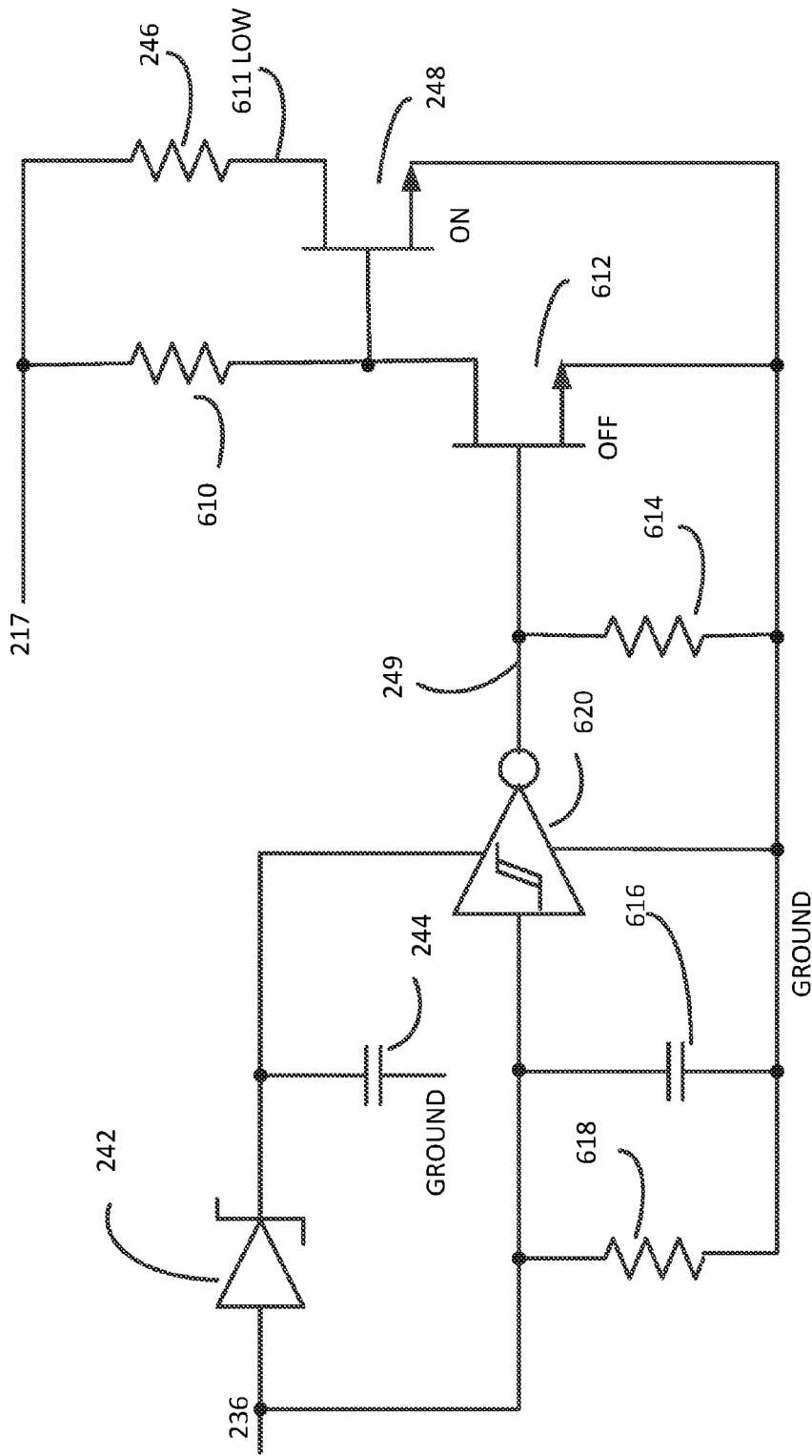
Figure 8:
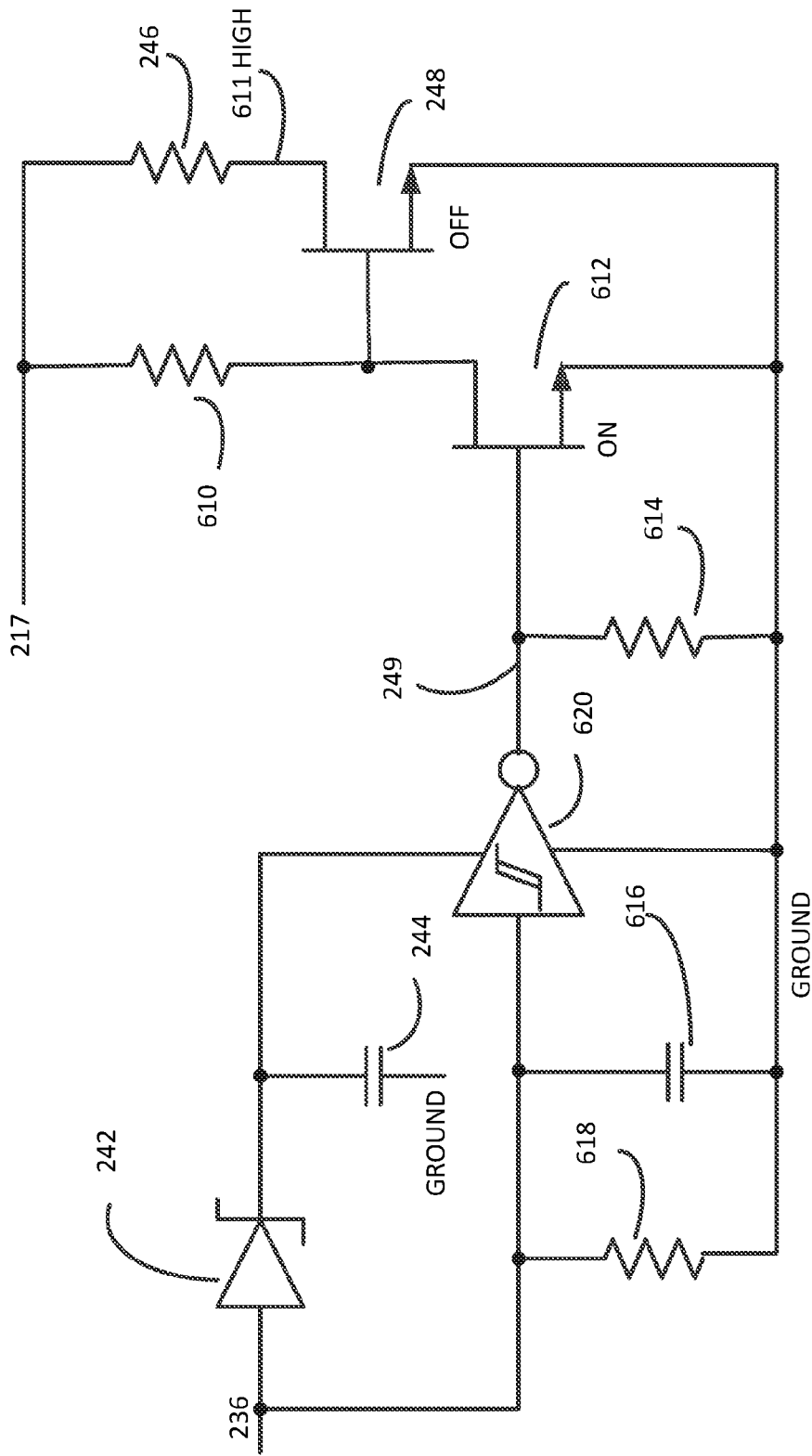

FIG. 6-8 illustrates the operation of an active pull-down circuit according to an embodiment of the present invention. In FIG. 6, the active pull-down circuit may include a pull-down resistor 246 in series with switch 248. This circuitry may also include a charge storage circuit including diode 242 and capacitor 244. A discharge resistor 614 may also be included.

When a second interface 122 is not connected to the cable housing this circuitry, then no voltage is received on line 236 and resistor 618 may pull the voltage on the 236 to ground. Similarly, resistor 614 may pull voltages on lines 249 and 643 to ground. This may shut off transistor 612.

Connection detect or CC pin 217 may be connected to the connection detect pin in downward-facing port 112. The pull-up resistor 216 in downward-facing port 112 may pull-up resistor 610 to turn on transistor 248. That is, the path through pull-up resistor 216 (as shown in FIG. 3) may form a power supply for transistor 248 in the absence of a power supply on line 236. Transistor 248 may then conduct, pulling line 611 low. This may connect pull-down resistor 246 to ground. Again, the resistor divider formed by resistors 216 and 246 may generate an intermediate voltage on connection detect or CC pin 217 that may be used by downward-facing port 112 to determine that a connection has been made.

In FIG. 7, second interface 122 may connect to cable 130. Accordingly, a voltage supply may be received on line 236. This voltage may charge capacitor 244 through disconnect diode 242. Inverter 620 may invert the high-voltage received on line 236 to a low voltage, thereby turning off transistor 612 once again. As before, the voltage on connection detect or CC pin 217 may pull-up on the gate of transistor 248, thereby turning transistor 248 on and driving line 611 low. The low voltage on line 611 may connect pull-down resistor 246 to the connection detect or CC pin 217.

In FIG. 8, second interface 122 may be disconnected. Line 236 may return low. Inverter 620 may invert this signal driving line 249 high. This may turn on transistor 612, which may in turn shut off transistor 248. Accordingly, line 611 may go high, thereby disconnecting pull-down resistor 246. This disconnection of resistor 246 may be seen by downward-facing port 112 as a disconnection of the second interface 122. Again, downward-facing port 112 may then shut off its power supply that is being provided to second interface 122. Discharge current may flow out of charge storage capacitor 244, through an output transistor in inverter 620, and through discharge resistor 614 to ground. At some point, the voltage on line 249 may discharge to the threshold voltage of transistor 612. Beyond that point, transistor 612 may turn off. This may then allow resistor 610 to pull-up on the gate of transistor 248, which may pull line 611 low thereby reconnecting pull-down resistor 246. When the power supply is removed from line 236, resistors 618 and capacitor 616 may control the decay of the voltage on line 236.

The types and sizes of these components may vary in different embodiments of the present invention. For example, the charge storage capacitor 244 may have a value of 0.1, 0.2, 0.22, 0.27 uF or other value. The discharge resistor 614 may have a value of 100 k, 200 k, 510 k, 750 k, or other value. Capacitor 616 and resistors 618 may be similarly sized. Resistor 610 may have a value of 100 k, 200 k, 510 k, 750 k, or other value. The transistors 612 and 248 may be N-channel MOSFETs. Inverter 620 may be a Schmidt-trigger inverter or other inverter. Disconnect diode 242 may be a Schottky barrier diode or other type of diode.

Figure 9:
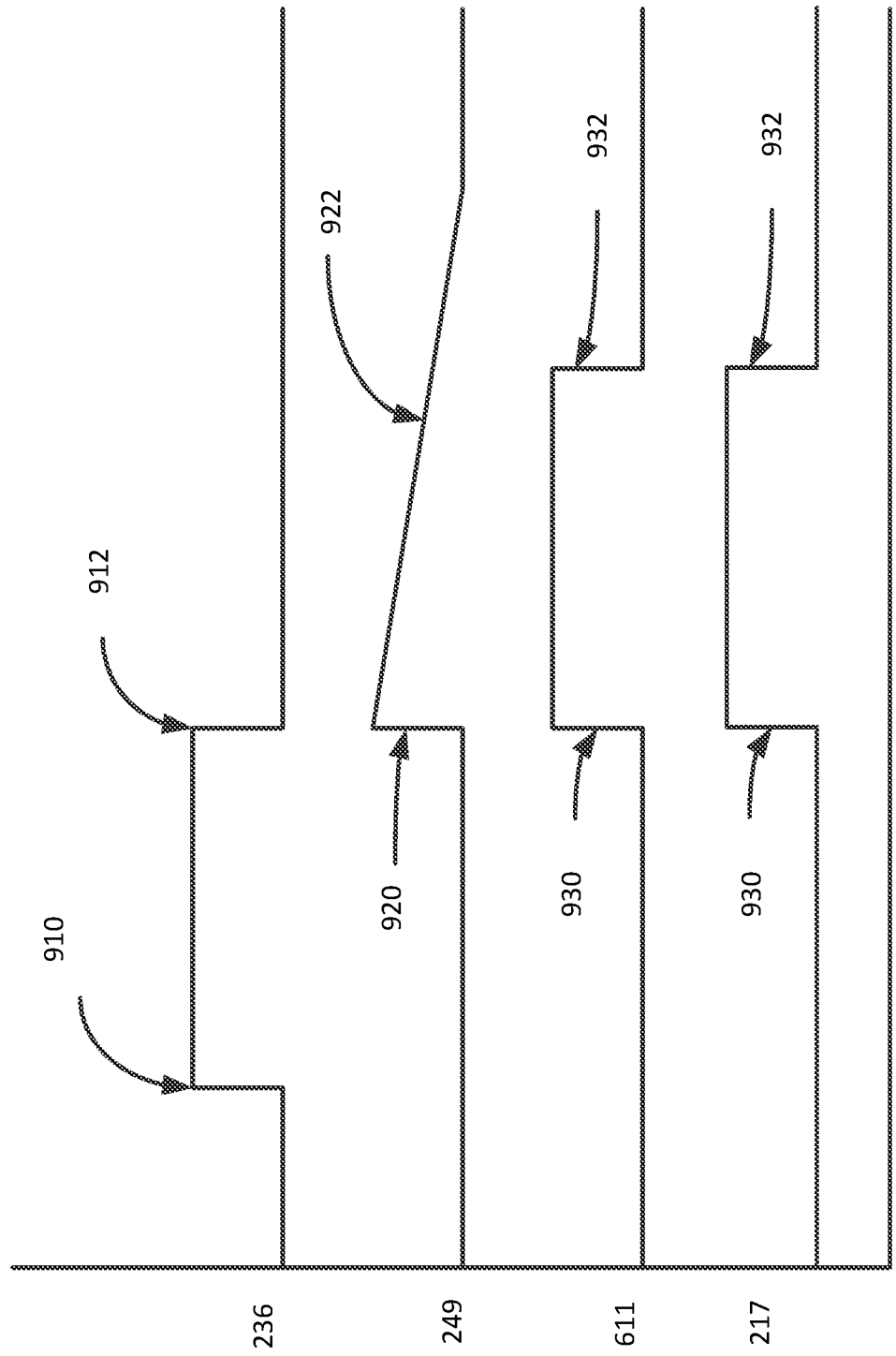
FIG. 9 illustrates a timing diagram for an active pull-down circuit according to an embodiment of the present invention.

FIG. 9 illustrates a timing diagram of waveforms in an active pull-down circuit according to an embodiment of the present invention. At time 910, a second interface 122 (shown in FIG. 2) may be connected and a voltage provided to the active pull-down circuit by second interface on line 236 may increase. This voltage may fall to zero after a disconnection of the second interface 122. The drop in voltage on line 236 may be inverted by inverter 620 leading to an increase in voltage on line 249 at time 920. Again, this voltage may decay over time 922. This time may be a function of the sizes of charge storage capacity 244 and discharge resistor 614. When the voltage on line 249 goes high at time 920, the voltage on line 611 follows and goes high at time 930. When voltage 249 decays to a threshold voltage of transistor 612, line 611 may return low at time 932. This may similarly pull the voltage on the connection detect or CC pin 217 low.

Embodiments of the present invention may provide active pull-down and other circuits that may be used with cables connecting various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These cables may provide pathways for signals and power compliant with various standards such as one of the Universal Serial Bus (USB) standards including USB Type-C, HDMI, DVI, Ethernet, DisplayPort, Thunderbolt, Lightning, JTAG, TAP, DART, UARTs, clock signals, power signals, and other types of standard, non-standard, and proprietary interfaces and combinations thereof that have been developed, are being developed, or will be developed in the future.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An active pull-down circuit comprising:
   a series network between a first terminal and ground, the series network comprising:
   a pull-down resistor; and
   a switch in series with the pull-down resistor; and
   a control circuit coupled to open the switch for a first period of time following a disconnection of a first connector receptacle of a first device and a first connector insert of a cable,
   wherein the first period of time is determined by a discharge rate of a capacitor.

2. The active pull-down circuit of claim 1 wherein the switch is a transistor.

3. The active pull-down circuit of claim 1 wherein the switch is an N-channel MOSFET.

4. The active pull-down circuit of claim 1 wherein the active pull-down circuit is housed in the cable.

5. The active pull-down circuit of claim 1 wherein the active pull-down circuit is housed in the first connector insert.

6. The active pull-down circuit of claim 5 wherein the first terminal is connected to a connection detect pin in a second connector insert of the cable.

7. The active pull-down circuit of claim 1 wherein the discharge rate of the capacitor is determined by a discharge resistor.

8. An active pull-down circuit comprising:
   a series network between a first terminal and ground, the series network comprising:
   a pull-down resistor; and
   a first transistor in series with the pull-down resistor;
   a charge storage circuit comprising:
   a diode having an anode coupled to a second terminal; and
   a capacitor coupled to a cathode of the diode; and
   an inverter having a power supply input coupled to the cathode of the diode and the capacitor, and an input coupled to the second terminal; and
   a discharge resistor coupled to an output of the inverter, wherein the output of the inverter is coupled to control the first transistor.

9. The active pull-down circuit of claim 8 wherein the inverter is a Schmidt-trigger inverter.

10. The active pull-down circuit of claim 8 wherein the output of the inverter is coupled to control the first transistor through a second transistor.

11. The active pull-down circuit of claim 10 wherein the output of the inverter is coupled to a gate of the second transistor, and a drain of the second transistor is coupled to the gate of the first transistor.

12. The active pull-down circuit of claim 11 wherein the first terminal is coupled to receive a connection detect signal from a first interface and the second terminal is coupled to receive a power supply from a second interface.

13. The active pull-down circuit of claim 12 wherein when the second interface is disconnected from the active pull-down circuit, the inverter provides a voltage level supplied by the charge storage circuit, where the voltage level turns off the first transistor until the discharge resistor discharges the voltage level supplied by the charge storage circuit to a threshold voltage of the second transistor.

14. The active pull-down circuit of claim 8 wherein the first terminal is coupled to receive a connection detect signal from a first interface and the second terminal is coupled to receive a power supply from a second interface.

15. The active pull-down circuit of claim 14 wherein when the second interface is disconnected from the active pull-down circuit, the inverter provides a voltage level supplied by the charge storage circuit, where the voltage level turns off the first transistor until the discharge resistor discharges the voltage level supplied by the charge storage circuit to a threshold voltage.

16. A cable comprising:
a first connector insert;
a second connector insert;
an active pull-down circuit comprising:
   a series network between a first terminal and ground, the series network comprising:
   a pull-down resistor; and
   a first transistor in series with the pull-down resistor;
a charge storage circuit comprising:
   a diode having an anode coupled to a second terminal; and
   a capacitor coupled to a cathode of the diode;
an inverter having a power supply input coupled to the cathode of the diode and the capacitor, and an input coupled to the second terminal; and
a discharge resistor coupled to an output of the inverter, wherein the output of the inverter is coupled to control the first transistor,
wherein the first terminal is coupled to a first pin in the first connector insert and the second terminal is coupled to a first pin in the second connector insert.

17. The cable of claim 16 wherein the first pin in the first connector insert is a connection detect pin.

18. The cable of claim 16 wherein the first connector insert is a USB Type-C connector insert and the first pin is a CC pin.

19. The cable of claim 17 wherein the first pin in the second connector insert is a power supply pin.

* * * * *